United States Patent
Chen et al.

(10) Patent No.: US 10,651,797 B2
(45) Date of Patent: May 12, 2020

(54) AMPLIFIER OFFSET AND COMPENSATION

(71) Applicant: Infineon Technologies Austria AG, Villach (AT)

(72) Inventors: Keng Chen, Sudbury, MA (US); Luca Petruzzi, Andover, MA (US)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/948,398

(22) Filed: Apr. 9, 2018

(65) Prior Publication Data
US 2019/0312551 A1    Oct. 10, 2019

(51) Int. Cl.
| | | |
|---|---|---|
| H03F 1/02 | (2006.01) | |
| H03F 3/45 | (2006.01) | |
| H03F 3/195 | (2006.01) | |
| H03F 3/68 | (2006.01) | |
| H03F 3/183 | (2006.01) | |

(52) U.S. Cl.
CPC ........... *H03F 1/0216* (2013.01); *H03F 3/183* (2013.01); *H03F 3/195* (2013.01); *H03F 3/45076* (2013.01); *H03F 3/45614* (2013.01); *H03F 3/68* (2013.01); *H03F 2200/375* (2013.01); *H03F 2203/45044* (2013.01); *H03F 2203/45588* (2013.01)

(58) Field of Classification Search
CPC .................................................... H03F 1/0216
See application file for complete search history.

(56) References Cited

U.S. PATENT DOCUMENTS

| | | | |
|---|---|---|---|
| 4,395,681 A | | 7/1983 | Hornung et al. |
| 5,512,814 A | * | 4/1996 | Allman .................... G05F 3/262 323/267 |
| 6,140,872 A | * | 10/2000 | McEldowney ......... H03F 1/303 327/307 |
| 7,605,647 B1 | | 10/2009 | Romero et al. |
| 2004/0012439 A1 | | 1/2004 | Chen et al. |
| 2005/0134488 A1 | | 6/2005 | Alter |
| 2006/0186954 A1 | * | 8/2006 | Koller ....................... H03F 1/34 330/9 |
| 2007/0115047 A1 | * | 5/2007 | D'Abramo ................ H03F 1/30 330/9 |
| 2007/0153945 A1 | * | 7/2007 | Gupta .................. H03F 3/45475 375/346 |

(Continued)

FOREIGN PATENT DOCUMENTS

| | | |
|---|---|---|
| EP | 1566885 A2 | 8/2005 |
| JP | H05243864 A | 9/1993 |
| WO | WO 0227942 A2 | 4/2002 |

OTHER PUBLICATIONS

European Search Report, EP 19 165 379.9, dated Aug. 27, 2019, pp. 8.

*Primary Examiner* — Patricia T Nguyen
(74) *Attorney, Agent, or Firm* — Armis IP Law, LLC

(57) ABSTRACT

An apparatus includes a first amplifier, a second amplifier, and a compensation-setting generator to generate a first amplifier compensation setting and second amplifier compensation setting. A controller is operable to: i) apply the first amplifier compensation setting to the first amplifier and apply the second amplifier compensation setting to the second amplifier. The controller is further operable to switch between generating updates to the first amplifier compensation setting and the second amplifier compensation setting.

32 Claims, 13 Drawing Sheets

(56) References Cited

U.S. PATENT DOCUMENTS

| | | | |
|---|---|---|---|
| 2007/0188223 A1* | 8/2007 | Nishimori | H03F 3/45183 330/51 |
| 2007/0258546 A1 | 11/2007 | Smelloy et al. | |
| 2008/0101775 A1* | 5/2008 | Harriman | G05B 11/28 388/803 |
| 2009/0167432 A1* | 7/2009 | van den Heuvel | H03F 3/45968 330/69 |
| 2010/0213983 A1* | 8/2010 | Eschauzier | H03F 3/45753 327/65 |
| 2010/0289568 A1* | 11/2010 | Eschauzier | H03F 3/347 330/9 |
| 2012/0274381 A1* | 11/2012 | Pyo | G01R 33/0029 327/307 |
| 2013/0015916 A1* | 1/2013 | Wan | H03F 3/45475 330/69 |
| 2015/0171885 A1 | 6/2015 | Juang et al. | |
| 2015/0236648 A1 | 8/2015 | Ahmad et al. | |
| 2015/0288336 A1 | 8/2015 | Kusada | |
| 2016/0013760 A1 | 1/2016 | Lam et al. | |
| 2018/0076780 A1* | 3/2018 | Wang | H03F 1/02 |

\* cited by examiner

AMPLIFIER OFFSET AND COMPENSATION

BACKGROUND

Conventional circuits may include one or more amplifiers to amplify a respective input signal. In general, an amplifier is an electronic device to increase the power or magnitude of a signal (a time-varying voltage or current). An amplifier typically uses electric power from a power supply to amplify the amplitude of a received signal to produce a respective amplified output signal. An amplified output signal can be used for any of multiple purposes such as drive an audio speaker, display screen, etc.

One type of amplifier is an operational amplifier. An operational amplifier (or sometimes referred to as an op-amp) is an Integrated Circuit (IC) that operates as a voltage amplifier. An op-amp has a differential input. That is, it has two inputs of opposite polarity. In certain instances, an op-amp has a single output and a very high gain, which means that the output signal is much higher than input signal. External passive components such as resistors, capacitors, etc., can be coupled to the operational amplifier to control its behavior and provide a desired output.

One attribute of an operational amplifier is its input referred offset voltage, which potentially cause amplification errors if it is a high value. Ideally, the input referred offset voltage associated with an operational amplifier is zero.

In conventional power management IC design, three common methods are used to correct input referred offset of a respective operational amplifier. For example, conventional methods include:

1.) Using large resistor chain as well as iDAC to minimize input referred offset. The disadvantage of this method is large space consumption; moreover, the trim process will also add cost to manufacture.

2.) Using an auxiliary amplifier to sensing/correcting the input referred offset voltage of targeting amplifier. The disadvantage of this method is each targeting amplifier needs an auxiliary amplifier which leads to large space consumption and design complexity; moreover, as the auxiliary amplifier need to be operated between auto zero phase and amplification phase, it requires a dedicated clock circuit.

3.) Using a chopping method in which the polarity of an input signal to the target amplifier needs to be constantly changed. The disadvantage of this method is the required change in polarity; it also requires a filter to be designed to filter out the switching noise.

BRIEF DESCRIPTION

Embodiments herein include novel ways of improving an accuracy of providing amplification and reducing affects of the input referred offset voltage.

More specifically, embodiments herein include a novel apparatus (such as hardware, circuitry, device, etc.) including a first amplifier, a second amplifier, and a compensation-setting generator to generate a first amplifier compensation setting and second amplifier compensation setting.

The novel apparatus further includes a controller operable to: i) apply (input) the first generated amplifier compensation setting to the first amplifier to provide compensation and apply (input) the second generated amplifier compensation setting to the second amplifier to provide compensation.

In accordance with further embodiments, the system as discussed herein includes a first compensator (associated with the first amplifier) and a second compensator (associated with the second amplifier). To provide compensation such as correction of an input referred offset voltage associated with the first amplifier (such as a multi-stage amplifier including a transconductance input amplifier stage), the first compensator generates a first correction output based on the first compensation setting and applies the first correction output to the first amplifier. To provide compensation such as correction of an input referred offset voltage associated with the second amplifier (such as a multi-stage amplifier including a transconductance input amplifier stage), the second compensator generates a second correction output based on the second compensation setting and applies it to the second amplifier.

To ensure more accurate amplification over time, the controller can be configured to switch between generating updates to the first amplifier compensation setting applied to the first compensator and the second amplifier compensation setting applied to the second amplifier.

More specifically, in accordance with further embodiments, the controller is operable to, in different time slots, switch between controlling the compensation-setting generator to generate the updates to the first amplifier compensation setting and the second amplifier compensation setting.

As previously discussed, the first amplifier compensation setting corrects an input (referred) offset voltage associated with the first amplifier. The second amplifier compensation setting corrects an input (referred) offset voltage associated with the second amplifier. Continually updating the first amplifier compensation setting (value) and the second amplifier compensation setting (value) (such as in different time slots) ensures more accurate compensation of input referred offset associated with the first amplifier and the second amplifier.

Note further that the compensation-setting generator can be configured to generate the first amplifier compensation setting and the second amplifier compensation setting in any suitable manner, and according to any suitable schedule. In one embodiment, the controller is operable to control the compensation-setting generator to repeatedly generate and update the first amplifier compensation setting and the second amplifier compensation setting in accordance with a cyclical time slotted schedule, switching between generating an update to the first amplifier compensation setting and an update to the second amplifier compensation setting.

A single compensation-setting generator can be configured to produce any number of compensation settings for any number of amplifiers. In accordance with a time slotted schedule, the compensation setting generator can be configured to generate respective compensation settings in a cyclical manner such that each of the compensation settings is constantly updated over time.

The cyclical schedule of repeatedly generating updated to compensation settings can be implemented based on any suitable clock signal. In one embodiment, the controller controls generation of the cyclical time slotted schedule based at least in part on a control output such as a PWM (Pulse With Modulation) control signal of a power supply that is used to control generation of an output voltage from a respective power converter circuit of the power supply.

In accordance with further embodiments, both the first amplifier and the second amplifier operate in a continuous amplification mode of amplifying a respective received signal to produce corresponding output (signals) while the compensation-setting generator switches between generating the first amplifier compensation setting and the second amplifier compensation setting.

In yet further embodiments, the first amplifier is a first multistage amplifier including a respective first amplifier stage coupled to drive a respective second amplifier stage. The first compensator is operable to drive at least one node coupling the respective first amplifier stage to the respective second amplifier stage of the first amplifier. The second amplifier is optionally a second multistage amplifier including a corresponding first amplifier stage coupled to drive a corresponding second amplifier stage of the second amplifier. The second compensator is operable to drive at least one node coupling the corresponding first amplifier stage to the corresponding second amplifier stage of the second amplifier.

Each of the first compensator and the second compensator can be of any suitable type. In one non-limiting example embodiment, the first compensator is a transconductance amplifier operable to output current to at least one node coupling the respective first stage of the first amplifier to the respective second stage of the first amplifier. The second compensator is optionally a transconductance amplifier operable to output current to the at least one node coupling the corresponding first stage of the second amplifier to the second stage of the second amplifier.

In one non-limiting example embodiment, to generate the first amplifier compensation setting and the second amplifier compensation setting, the controller is operable to: i) selectively couple an input of the first amplifier to the compensation-setting generator to produce the first compensation setting, and ii) selectively couple an input of the second amplifier to the compensation-setting generator to produce the second compensation setting. In a manner as previously discussed, the generation of the amplifier compensation settings can be done in different time slots.

In accordance with further embodiments, when generating the first compensation setting, the controller is operable to: electrically decouple the compensation-setting generator from the second amplifier, and ii) electrically couple the compensation-setting generator to an input of the first amplifier.

When generating the second compensation setting, the controller is operable to: electrically decouple the compensation-setting generator from the first amplifier, and ii) electrically couple the compensation-setting generator to an input of the second amplifier.

The first compensator and the second compensator can be configured in any suitable manner to provide compensation. In one example embodiment, the first compensator includes: i) a first storage circuit to store the first amplifier compensation setting, and ii) a first transconductance compensation amplifier to drive the first amplifier with a correction output whose magnitude depends on a magnitude of the first amplifier compensation setting stored in the first storage circuit. The second compensator includes: i) a second storage circuit to store the second amplifier compensation setting, and ii) a second transconductance compensation amplifier to drive the second amplifier with a correction output whose magnitude depends on a magnitude of the second amplifier compensation setting stored in the second storage circuit.

Embodiments herein are useful over conventional techniques. For example, certain embodiments herein require only one offset correction circuit (compensation setting generator) to compensate the input referred offset voltage associated with each of multiple amplifiers. Thus, one embodiment herein includes sharing one offset compensator between multiple targeting amplifiers, which will save valuable circuit board area as well as cost of components. When implemented in power management POL circuit, direct use of PWM signal (as an input to the controller) will also eliminate designing oscillator circuit, which further improves the simplicity of the design.

These and other more specific embodiments are disclosed in more detail below.

Note that techniques as discussed herein can be implemented in any suitable environment such as amplifier circuitry, power supplies, multi-phase power supply applications, single phase point of load (a.k.a., POL) power supply applications, etc.

Note further that although embodiments as discussed herein are applicable to multi-phase power supply circuits such as those implementing buck converters, DC-DC converter phases, the concepts disclosed herein may be advantageously applied to any other suitable topologies as well as general power supply control applications.

Additionally, note that embodiments herein can include computer processor hardware (that executes corresponding switch instructions) to carry out and/or support any or all of the method operations disclosed herein. In other words, one or more computerized devices or processors (computer processor hardware) can be programmed and/or configured to operate as explained herein to carry out different embodiments of the invention.

Yet other embodiments herein include software programs to perform the steps and operations summarized above and disclosed in detail below. One such embodiment comprises a computer program product that has non-transitory computer-storage media (e.g., memory, disk, flash, . . . ) including computer program instructions and/or logic encoded thereon that, when performed in a computerized device having a processor and corresponding memory, programs the processor to perform any of the operations disclosed herein. Such arrangements are typically provided as software instructions, code, and/or other data (e.g., data structures) arranged or encoded on a computer readable storage medium or non-transitory computer readable media such as an optical medium (e.g., CD-ROM), floppy or hard disk or other a medium such as firmware or microcode in one or more ROM or RAM or PROM chips, an Application Specific Integrated Circuit (ASIC), circuit logic, etc. The software or firmware or other such configurations can be installed onto a respective controller circuit to cause the controller circuit (such as logic) to perform the techniques explained herein.

Accordingly, one embodiment of the present disclosure is directed to a computer program product that includes a computer readable medium having instructions stored thereon for supporting operations such as controlling one or more phases in a power supply. For example, in one embodiment, the instructions, when carried out by computer processor hardware (one or more computer devices, control logic, digital circuitry, etc.), cause the computer processor hardware to: generate a first amplifier compensation setting and a second amplifier compensation setting (during different time slots), the first amplifier compensation setting generated to correct an input offset voltage associated with a first amplifier, the second amplifier compensation setting generated to correct an input offset voltage associated with a second amplifier; apply/input the first compensation setting to a first compensator, the first compensator providing compensation to the first amplifier; apply/input the second compensation setting to a second compensator, the second compensator providing compensation to the second amplifier; and switch between updating the first compensation setting applied to the first compensator and the second compensation setting applied to the second amplifier.

The ordering of the operations has been added for clarity sake. The operations can be performed in any suitable order.

It is to be understood that the system, method, device, apparatus, logic, etc., as discussed herein can be embodied strictly as hardware (such as analog circuitry, digital circuitry, logic, etc.), as a hybrid of software and hardware, or as software alone such as within a processor, or within an operating system or a within a software application.

Note that although each of the different features, techniques, configurations, etc., herein may be discussed in different places of this disclosure, it is intended, where appropriate, that each of the concepts can optionally be executed independently of each other or in combination with each other. Accordingly, the one or more present inventions as described herein can be embodied and viewed in many different ways.

Also, note that this preliminary discussion of embodiments herein purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section and corresponding figures of the present disclosure as further discussed below.

BRIEF DESCRIPTION OF THE DRAWINGS

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

Figure 1:
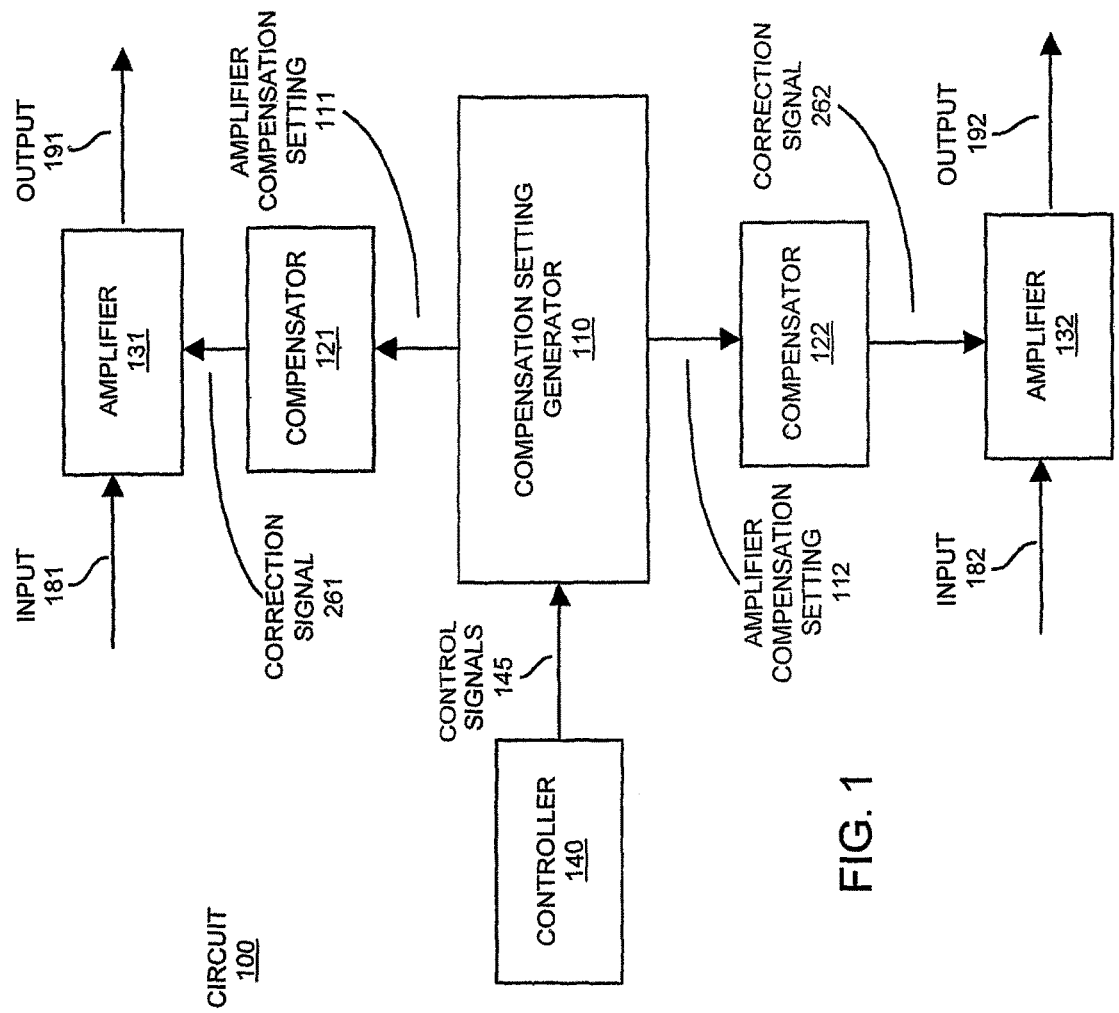
FIG. 1 is an example diagram illustrating compensated amplifiers according to embodiments herein.

Now, more specifically, FIG. 1 is an example diagram of an apparatus 100 according to embodiments herein.

As shown, the apparatus 100 (which can be embodied in any suitable form such as hardware, circuitry, device, etc.) includes controller 140, compensation-setting generator 110, compensator 121, compensator 122, amplifier 131, and amplifier 132. Thus, each of these resources can be implemented as hardware, circuitry, a device, etc.

In general, the controller 140 generates control output 145 (one or more control signals) to control compensation-setting generator 110 and generation of amplifier compensation setting 111 and amplifier compensation setting 112. The first amplifier compensation setting 111 is generated to correct (or reduce) affects of an input (referred) offset voltage associated with the first amplifier 131. The second amplifier compensation setting is generated to correct or reduce affects of an input (referred) offset voltage associated with the second amplifier 132

Thus, the first amplifier compensation setting 111 provides correction to an input offset voltage associated with the first amplifier 131; the second amplifier compensation setting 112 corrects an input offset voltage associated with the second amplifier.

During operation, as its name suggests, the first compensator 121 provides compensation to first amplifier 131 based on amplifier compensation setting 111. The second compensator provides compensation to second amplifier 132 based on amplifier compensation setting 112.

The compensation-setting generator 110 generates a first amplifier compensation setting 111 and second amplifier compensation setting 112. The controller is operable to: i) apply (input) the first amplifier compensation setting 111 to the first compensator 121 and apply (input) the second amplifier compensation setting 112 to the second compensator 122.

To ensure more accurate amplification over time, the controller 140 is operable to repeatedly switch between generating updates to the first amplifier compensation setting 111 inputted to the first compensator 121 and the second amplifier compensation setting 112 inputted to the second compensator 122.

In one embodiment, the compensator 121 can include a storage circuit or buffer to store the generated first amplifier compensation setting 111; the compensator 122 can include a storage circuit or buffer to store the generated first amplifier compensation setting 111.

To provide compensation such as correction of an input referred offset voltage associated with the first amplifier 131, the first compensator 121 generates a first correction output 261 based on the first compensation setting 111 and applies (inputs) the first correction output 261 to the first amplifier 131.

In a similar manner, to provide compensation such as correction of an input referred offset voltage associated with the second amplifier 132, the second compensator 122 generates a second correction output 262 based on the second compensation setting 112 and applies (inputs) the correction output 262 to the second amplifier 132.

Figure 12:
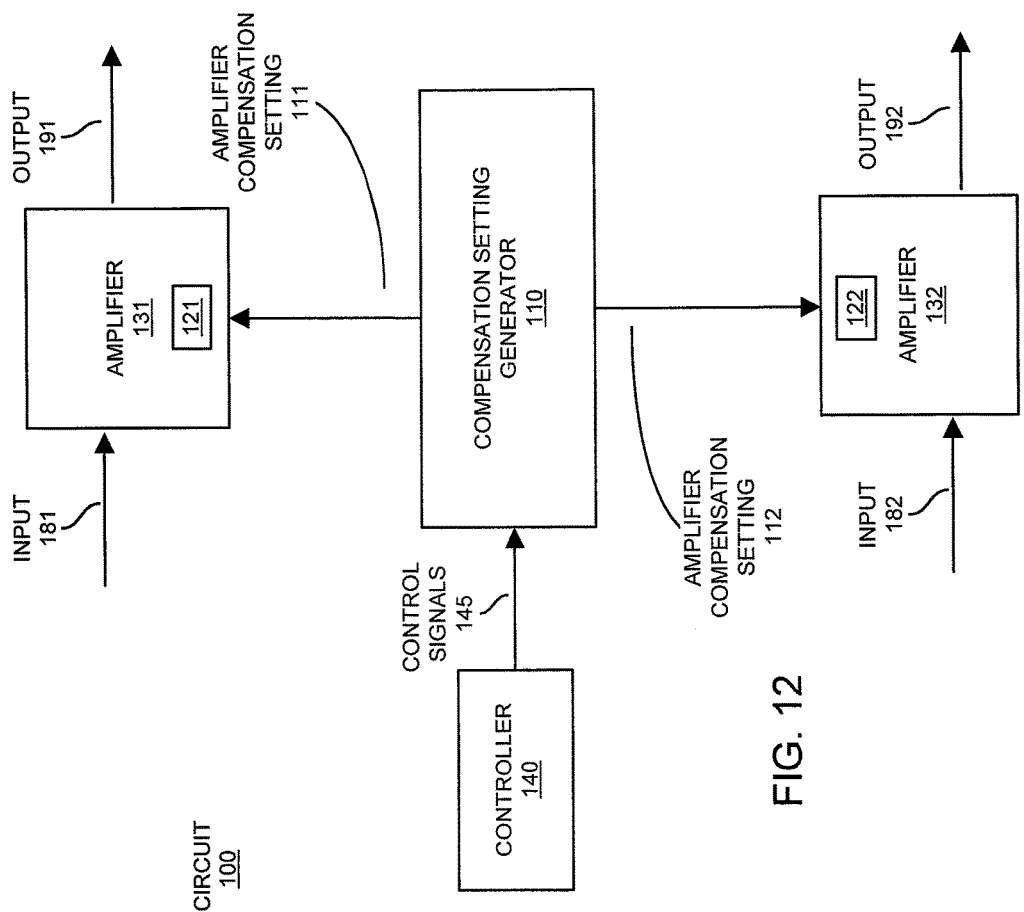
FIG. 12 is an example diagram illustrating a compensated amplifier according to embodiments herein.

In one embodiment, as shown in FIG. 12, the compensator 121 is integrated or fabricated as part of the amplifier 131; the compensator 122 is integrated or fabricated as part of the amplifier 132. In such an instance, via input from the controller 140, the compensation setting generator 110 is operable to apply the first amplifier compensation setting 111 to the first amplifier 131 to provide respective compensation; the controller 140 is operable to apply the second amplifier compensation setting 112 to the second amplifier 132 to provide respective compensation.

Figure 13:
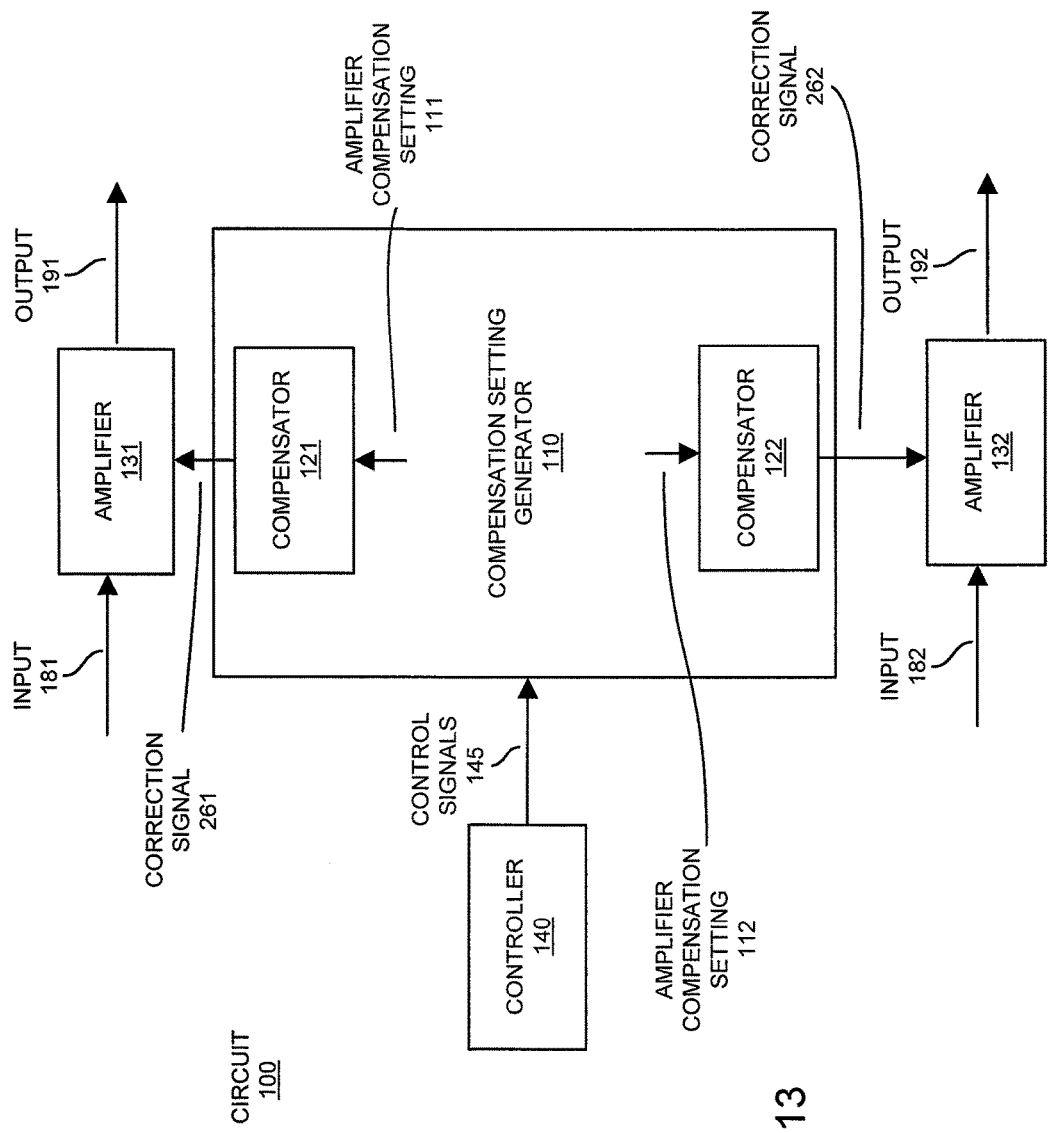
FIG. 13 is an example diagram illustrating a compensated amplifier according to embodiments herein.

In accordance with further embodiments, as shown in FIG. 13, the compensator 121 is integrated or fabricated as part of the compensation setting generator 110; additionally, the compensator 122 is integrated or fabricated as part of the compensation setting generator 110. In such an instance, via input from the controller 140, the compensation setting generator 110 is operable to apply the correction output signal 261 to the amplifier 131 to provide respective compensation; the compensation setting generator 110 is operable to apply the correction output signal 262 to the amplifier 132 to provide respective compensation.

Referring again to FIG. 1, in accordance with further embodiments, the controller 140 is operable to generate the amplifier compensation settings 111 and 112 in different time slots. In such an instance, the controller 140 switches between controlling the compensation-setting generator 110 to generate an update to the first amplifier compensation setting 111 and the second amplifier compensation setting 112.

As further described herein, continually updating the first amplifier compensation setting 111 (value) and the second amplifier compensation setting 112 (value) ensures more accurate compensation of input referred offset associated with the first amplifier 131 and the second amplifier 132. In other words, if the input referred offset voltage associated with the first amplifier 131 and/or the second amplifier 132 changes over time, continuous updating of the respective amplifier compensation setting 111 and amplifier compensation setting 112 ensures constant correction and therefore more accurate amplification (via amplifier 131) of the input signal 181 into the output signal 191 and more accurate amplification (via amplifier 132) of the input signal 182 into the output signal 192.

Figure 2:
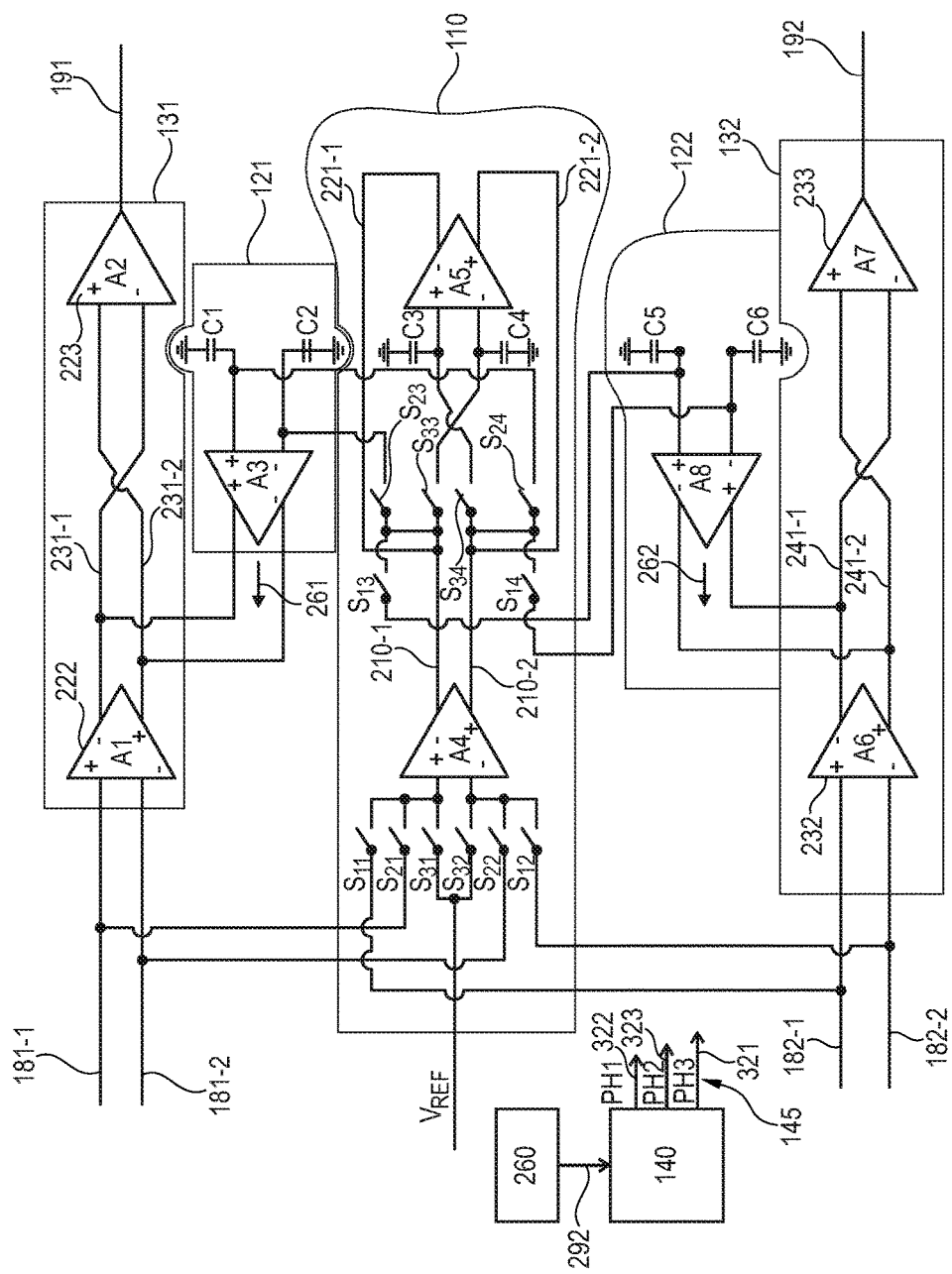
FIG. 2 is an example diagram of an apparatus providing amplifier compensation according to embodiments herein.

FIG. 2 is an example diagram of an apparatus providing amplifier compensation according to embodiments herein.

As previously discussed, the compensation-setting generator 110 generates the first amplifier compensation setting 111 and the second amplifier compensation setting 112.

In one embodiment, the compensation-setting generator 110 controlled by the controller 140 includes an offset compensator A4 (such as a linear differential amplifier), a transconductance amplifier stage A5, and a storage circuit (capacitors C3 and C4) to generate the amplifier compensation settings 111 and 112. In alternative embodiments, the storage circuit is a digital buffer storing a digital representation of the amplifier compensation setting associated with the offset compensator A4.

As further discussed below, the capacitors C3 and C4 of the compensation setting generator 110 store an amplifier compensation setting derived by the transconductance amplifier stage A4 of the compensation-setting generator 110 during a so-called auto-zeroing phase during which the amplifier A4 of compensation setting generator 110 is calibrated. In such an instance, when generating a respective amplifier compensation setting 111 or 112, the transconductance amplifier stage A4 of the compensation-setting generator 110 is operable to produce and output a correction output 221 (such as differential output signals 221-1 and 221-2) whose magnitude depends on a magnitude of the amplifier compensation setting (voltage) stored in the capacitors C3 and C4 (storage circuit). Details of calibrating the compensation setting generator 110 are further discussed below in FIGS. 3, 4, and 6.

As further shown in FIG. 2, by way of non-limiting example embodiment, the first amplifier 131 is a first multistage amplifier including a respective first transconductance amplifier stage 222 (A1) coupled to drive a respective second amplifier stage 223 (A2).

In one embodiment, the first transconductance amplifier stage 222 of amplifier 131 is a differential transconductance input amplifier stage. In accordance with further embodiments, the gain of first transconductance amplifier stage 222 in amplifier 131 is substantially greater (such as more than 5 times or any other suitable multiple greater) than a gain of transconductance amplifier A3. The gain of first transconductance amplifier stage 232 (A6) in amplifier 132 is substantially greater (such as more than 5 times or any other suitable multiple greater) than a gain of transconductance amplifier A8.

In general, each of the transconductance amplifiers (such as amplifiers A1, A3, A5, A6, and A8) as discussed herein receives a differential input voltage. Based on a respective transconductance gain associated with the respective amplifier, and a differential voltage inputted across the inverting and non-inverting inputs, the transconductance amplifiers outputs a differential output current. A magnitude of the output current of the respective transconductance amplifier on each differential output is ideally equal. However, the polarity of the output current is opposite. For example, the non-inverting current output from transconductance amplifier A3 is opposite to inverting current output from transconductance amplifier A3. Each of the transconductance amplifiers operates in a similar manner.

As further described herein, the output 261 (such as differential current) from amplifier A3 provides compensation to the output of transconductance amplifier A1 to correct the input referred offset associated with transconductance amplifier A1; the output current 262 (such as differential current) from amplifier A8 provides compensation to the output of transconductance amplifier A8 to correct the input referred offset associated with transconductance amplifier A8.

The first compensator 121 includes a transconductance amplifier A3 operable to drive respective correction output 261 (such as differential output current signals) to multiple nodes (such as node 231-1 and node 231-2) coupling the respective first transconductance amplifier stage 222 of the first amplifier 131 to the respective second amplifier stage 223 of the first amplifier 131.

A magnitude of the correction output 261 (one or more signals) outputted by the transconductance amplifier A3 of compensator 121 depends on the magnitude of the amplifier compensation setting 111 (voltage) stored in capacitor C1 and C2 (storage circuit) as generated by the compensation setting generator 110.

By way of a further non-limiting example embodiment, the second amplifier 132 is a second multistage amplifier including a respective first transconductance amplifier stage 232 (A6) coupled to drive a respective second amplifier stage 233 (A7).

In one embodiment, the first transconductance amplifier stage 232 of amplifier 132 is a differential transconductance input amplifier stage. In accordance with further embodiments, the gain of first transconductance amplifier stage 232 in amplifier 132 is substantially greater (such as more than 5 times greater) than a gain of amplifier A8. The gain of first transconductance amplifier stage 232 in amplifier 132 is substantially greater (such as more than 5 times greater) than a gain of transconductance amplifier A8.

The second compensator 122 includes a transconductance amplifier A8 operable to drive respective correction output 262 (one or more output current signals) to multiple nodes (such as node 241-1 and node 241-2) coupling the respective first amplifier stage 232 of the second amplifier 132 to the respective second amplifier stage 233 of the second amplifier 132.

A magnitude of the correction output 262 outputted by the transconductance amplifier A8 of compensator 122 depends on the magnitude of the amplifier compensation setting 112 (voltage) stored in capacitor C5 and C6 (storage circuit) as generated by the compensation setting generator 110.

In accordance with further embodiments, both the first amplifier 131 and the second amplifier 132 can be configured to operate in a continuous amplification mode of amplifying a respective received signal to produce corresponding output signals while the compensation-setting generator 110 switches between generating the first amplifier compensation setting 111 and the second amplifier compensation setting 112.

As further shown in FIG. 2, the compensation setting generator 110 further includes switches S11, S12, S13, S14, S21, S22, S23, S24, S31, S32, S33, and S34. The controller 140 controls activation of the groupings of switches during different control phases. For example, switches S11, S12, S13, and S14 represents a first group of switches simultaneously controlled by control output 322; switches S21, S22, S23, and S24 represents a second group of switches simultaneously controlled by control output 323; switches S31, S32, S33, and S34 represents a third group of switches simultaneously controlled by control output 321. Assume that the controller produces switch control output 321 to activate the first group of switches including switches S31, S32, S33, and S34. As further discussed below in more detail, activation of switches S31 and S32 to ON states causes the reference voltage Vref to be inputted to both the inverting out and non-inverting node of amplifier A4. The magnitude of Vref can be any suitable value. If amplifier A4 was an ideal operational amplifier, applying the same input voltage value to both the inverting and non-inverting would result in generation of the same output voltage for voltage 210-1 and voltage 210-2. However, due to the input referred offset voltage associated with amplifier A4, the magnitude of voltage 210-1 and voltage 210-2 are different.

In this example embodiment during activation of switches S31 and S32 to ON states, the amplifier A4 produces a respective output voltage 210-1 that is conveyed through switch S33 (activated to ON state as well) to the inverting input of transconductance amplifier A5 and storage circuit (capacitor C3). Capacitor C3 stores the generated voltage 210-1. Additionally, amplifier A4 produces a respective output voltage 210-2 that is conveyed through switch S34 (activated to ON state) to the non-inverting input of transconductance amplifier A5 and storage circuit (capacitor C4). Capacitor C4 stores the voltage 210-2.

Assume that the controller 140 produces switch control output 322 to simultaneously activate the group of switches including switches S11, S12, S13, and S14 to ON states.

In such an instance, activation of switch S11 to an ON state causes the input signal 182-1 to be inputted to the non-inverting node of amplifier A4. Activation of switch S12 to an ON state in phase Q2 causes the input signal 182-2 to be inputted to the inverting node of amplifier A4. Thus, via activation of the switches S11 and S12 to ON states, the controller 140 is operable to: electrically couple the compensation-setting generator 110 to the input of the second amplifier 132.

Further, during activation of the first group of switches S11, S12, S13, and S14 to ON states, the amplifier A4 produces a respective output voltage 210-1 that is conveyed through switch S13 (activated to ON state) to the non-inverting input of transconductance amplifier A5 and storage circuit (capacitor C5). Capacitor C5 stores the voltage 210-1. The amplifier A4 also produces a respective output voltage 210-2 that is conveyed through switch S14 (activated to ON state) to the inverting input of transconductance amplifier A8 and storage circuit (capacitor C6). Capacitor C6 stores the voltage 210-2.

The prior stored voltage in capacitors C5 and C6 causes the transconductance amplifier A8 to provide correction to the voltage 210-1 and voltage 210-2 generated by the amplifier A4. Accordingly, the prior stored voltage in capacitors C3 and C4 provides correction to the amplifier A4 when generating the amplifier compensation setting 112 stored in capacitors C5 and C6.

Assume that the controller 140 produces switch control output 323 to simultaneously activate the group of switches including switches S21, S22, S23, and S24 to ON states.

Activation of switch S21 to an ON state in phase Q4 causes the input signal 181-1 to be inputted to the non-inverting node of amplifier A4. Activation of switch S22 to an ON state causes the input signal 181-2 to be inputted to the inverting node of amplifier A4. Thus, via activation of the switches S21 and S22, the controller 140 is operable to: electrically couple the compensation-setting generator 110 to the input of the first amplifier 131, and electrically decouple (via deactivation of switches S11 and S12) the compensation-setting generator 110 from an input of the second amplifier 132.

In such an instance, during simultaneous activation of switches S21, S22, S23, and S24, the amplifier A4 produces a respective output voltage 210-1 that is conveyed through switch S23 (activated to ON state) to the inverting input of transconductance amplifier A3 and storage circuit (capacitor C2). Capacitor C2 stores the voltage 210-1. The amplifier A4 also produces a respective output voltage 210-2 that is conveyed through switch S24 (activated to ON state) to the non-inverting input of transconductance amplifier A3 and capacitor C1. Capacitor C1 stores the voltage 210-2.

The prior stored voltage in capacitors C3 and C4 causes the transconductance amplifier A5 to provide correction to the voltage 210-1 and voltage 210-2 generated by the amplifier A4. Accordingly, the prior stored voltage in capacitors C3 and C4 provides correction to the amplifier A4 when generating the amplifier compensation setting 111 stored in capacitors C1 and C2.

Note that, in one embodiment, amplifiers A3 and A8 in FIG. 2 along with the corresponding circuitry C1 and C2, and C5 and C6 respectively, are so-called "auxiliary stages," in particular of the associated amplifier 131, 132. In such an instance, such as captured by FIG. 12, the auxiliary stages A3, and A8 as well as corresponding circuitry C1, C2, C5, and C6 are potentially part of the amplifier 131 for A3, and amplifier 132 for A8. Alternatively, they may form part of the compensation setting generator 110.

Note that, in one embodiment, amplifiers A3, A5 and A8 in FIG. 2, are so-called "auxiliary stages" associated with the compensation setting generator 110. In such an instance, such as captured by FIG. 13, each of the auxiliary stages A3, A5, and A8, as well as corresponding circuitry C1, C2, C3, C4, C5, and C6 are potentially part of the compensation-setting generator 110.

Figure 3:
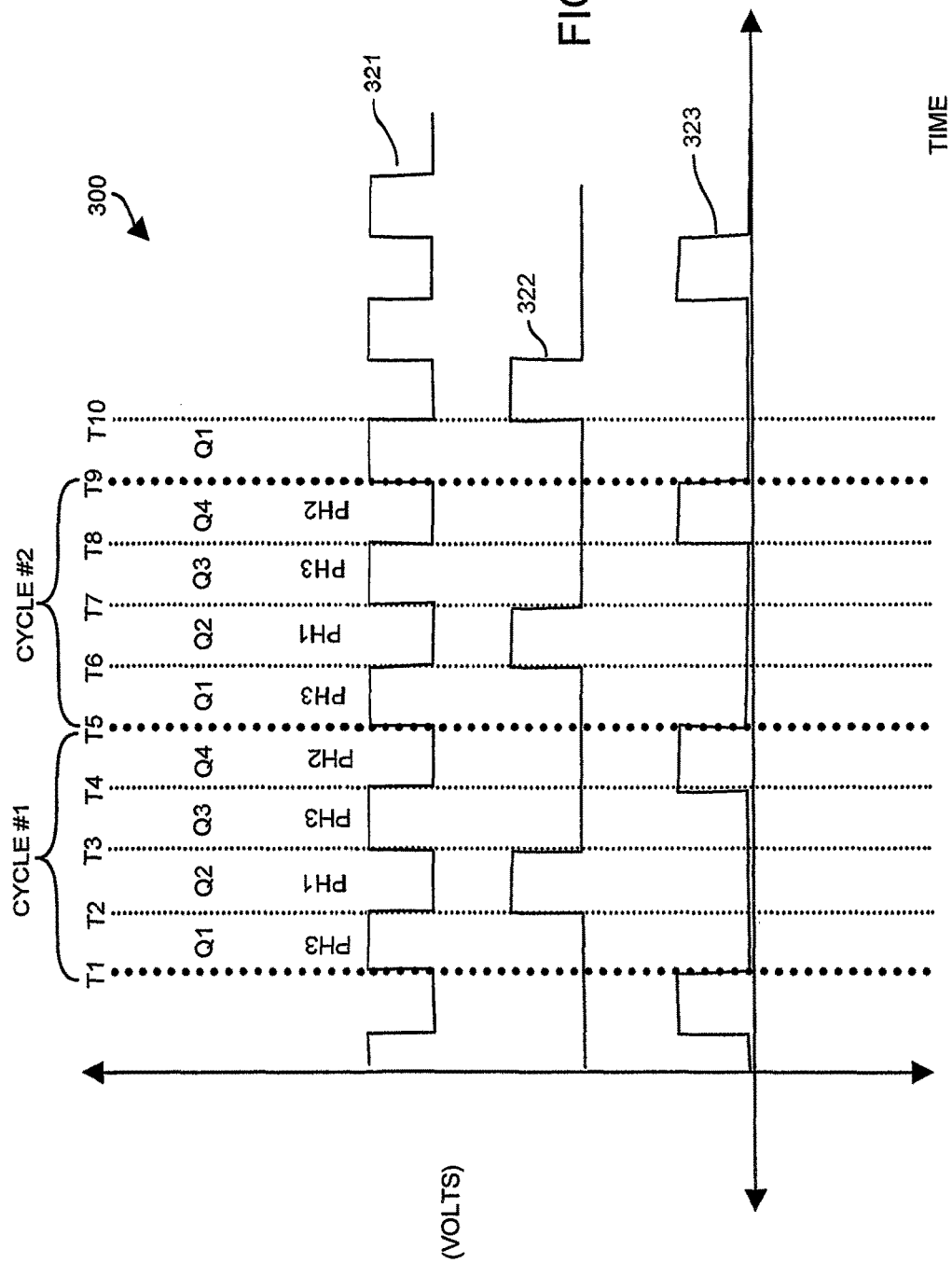
FIG. 3 is an example timing-diagram of controlling a respective compensation-setting generator according to embodiments herein.

FIG. 3 is an example timing-diagram of controlling a respective compensation-setting generator according to embodiments herein.

As previously discussed, the compensation-setting generator 110 can be configured to generate the first amplifier compensation setting 111 and the second amplifier compensation setting 112 in any suitable manner, and according to any suitable schedule.

In one embodiment, the controller 140 is operable to generate control output 145 (switch control output 320, 321, and 322) to control the compensation-setting generator 110 to repeatedly generate and update the first amplifier compensation setting 111 (stored in one embodiment as a differential voltage in capacitors C1 and C2) and the second amplifier compensation setting (stored in one embodiment as a differential voltage in capacitors C5 and C6) in accordance with a cyclical time slotted schedule 300 that switches between: i) generating and applying an update to the first amplifier compensation setting 111 and ii) generating and applying an update to the second amplifier compensation setting 112.

Switch control output 321 of schedule 300 controls activation/deactivation of switches S31, S32, S33, and S34. Logic high of switch control output 321 indicates times of activating these switches to ON states while logic low indicates times of deactivating switches to OFF states.

Switch control output 322 of schedule 300 controls activation/deactivation of switches S11, S12, S13, and S14. Logic high of switch control output 322 indicates times of activating these switches to ON states while logic low indicates times of deactivating switches to OFF states.

Switch control output 323 of schedule 300 controls activation/deactivation of switches S21, S22, S23, and S24. Logic high of switch control output 323 indicates times of activating these switches to ON states while logic low indicates times of deactivating switches to OFF states.

The cyclical time slot schedule 300 can be implemented based on any suitable clock signal. In one embodiment, the controller 140 controls generation of the cyclical time slotted schedule based at least in part on a control signal (clock signal 292 of FIG. 2) such as a PWM (Pulse With Modulation) control signal of a power supply 260 that is used to control generation of an output voltage from a respective power converter circuit.

In this example embodiment, each calibration cycle includes four phases, namely, phase Q1, phase Q2, phase Q3, and phase Q4.

Figure 4:
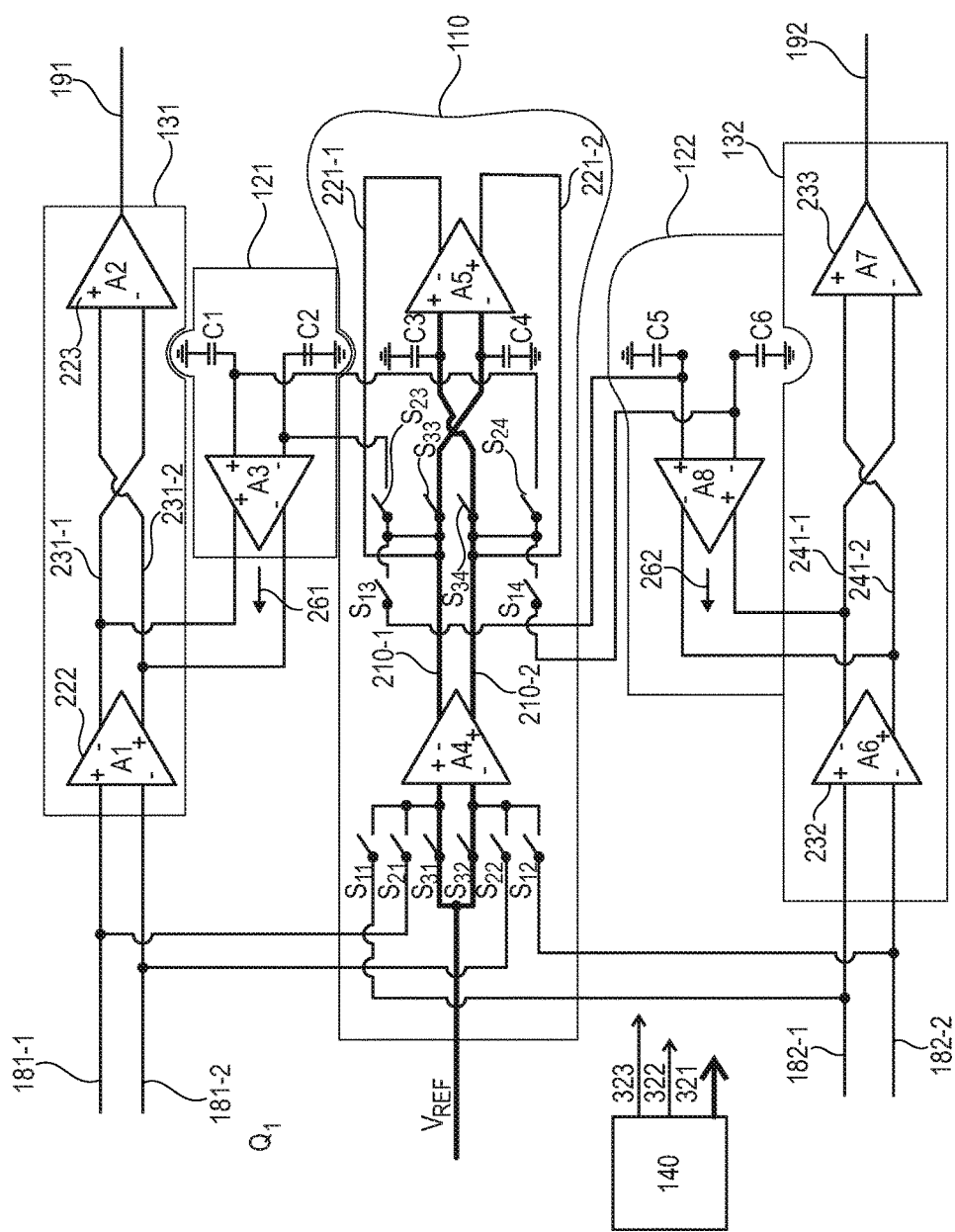
FIG. 4 is an example diagram illustrating automatic zeroing (calibration) of a compensation-setting generator according to embodiments herein.

In phase Q1, such as between time T1 and T2 for cycle #1, the controller 140 produces switch control output 321 to be a high state to activate the switches S31, S32, S33, and S34 to an ON state. During phase Q1, the controller 140 produces switch control output 322 as a low state to deactivate the switches S11, S12, S13, and S14 to an OFF state. During phase Q1, the controller 140 produces switch control output 323 to be in a low state to deactivate the switches S21, S22, S23, and S24 to an OFF state. Note that subsequent FIG. 4 illustrates settings of switches and circuit connectivity for phase Q1.

Figure 5:
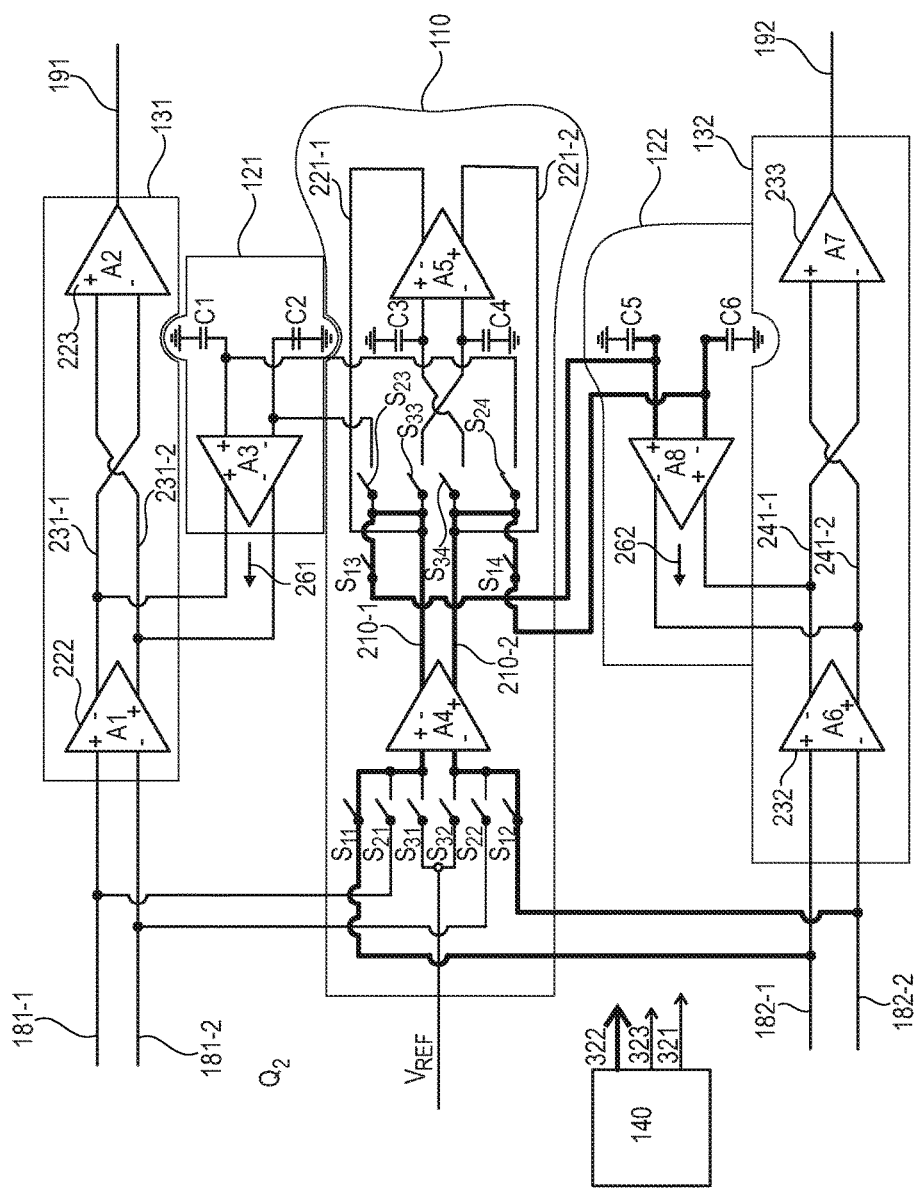
FIG. 5 is an example diagram illustrating generation of a first amplifier compensation setting according to embodiments herein.

Referring again to FIG. 3, in phase Q2, such as between time T2 and T3 for cycle #1, the controller 140 produces switch control output 322 to be a high state to activate the switches S11, S12, S13, and S14 to an ON state. During phase Q2, the controller 140 produces switch control output 323 to be a low state to deactivate the switches S21, S22, S23, and S24 to an OFF state. During phase Q2, the controller 140 produces switch control output 321 to be a low state to deactivate the switches S31, S32, S33, and S34 to an OFF state. FIG. 5 illustrates settings of switches and circuit connectivity for phase Q2.

Figure 6:
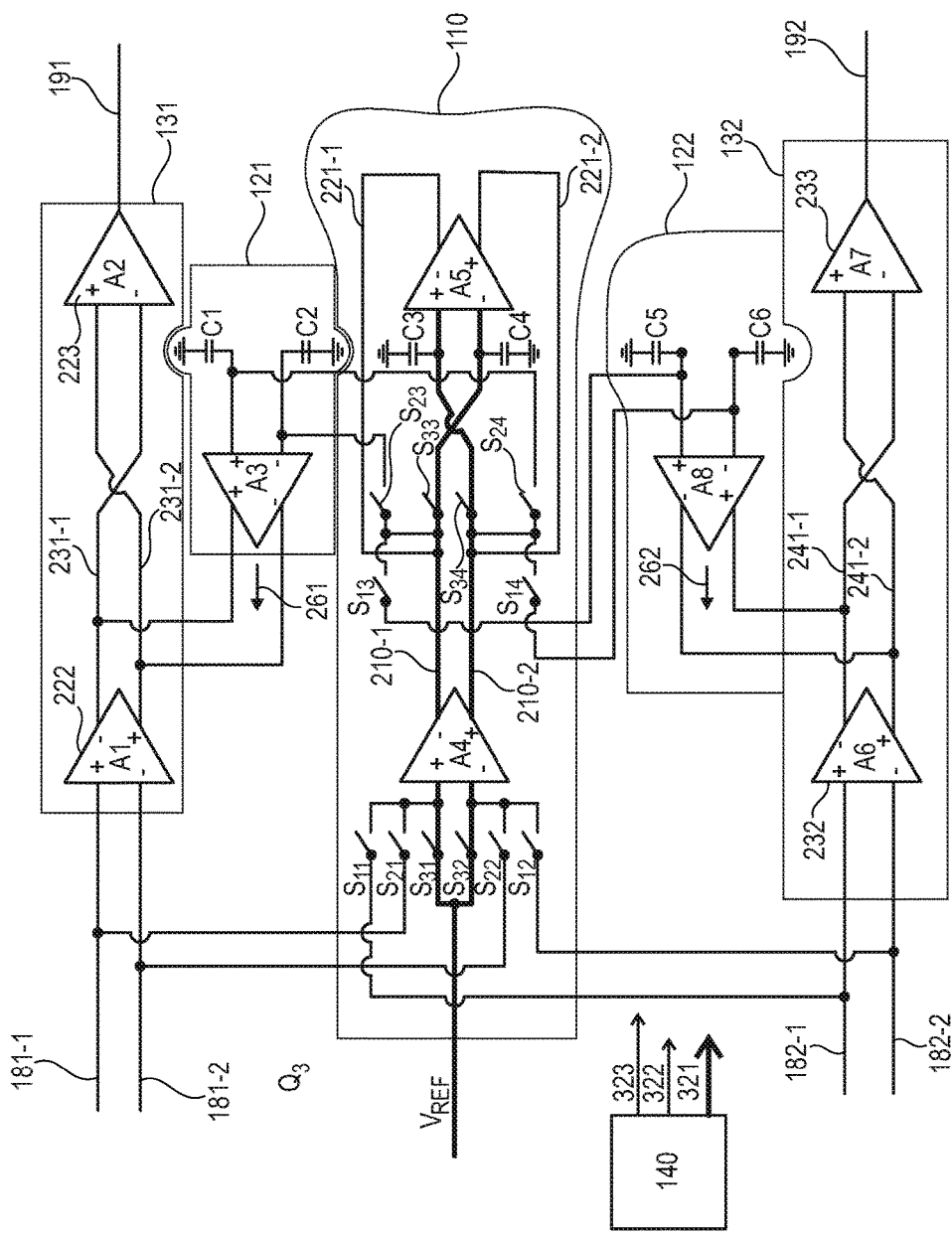
FIG. 6 is an example diagram illustrating an automatic zeroing (calibration) of the compensation-setting generator according to embodiments herein.

Referring again to FIG. 3, in phase Q3, such as between time T3 and T4 for cycle #1, the controller 140 produces switch control output 321 to be a high state to activate the switches S31, S32, S33, and S34 to an ON state. During phase Q3, the controller 140 produces switch control output 322 to be a low state to deactivate the switches S11, S12, S13, and S14 to an OFF state. During phase Q3, the controller 140 produces switch control output 322 to be a low state to deactivate the switches S21, S22, S23, and S24 to an OFF state. FIG. 6 illustrates settings of switches and circuit connectivity for phase Q3.

Figure 7:
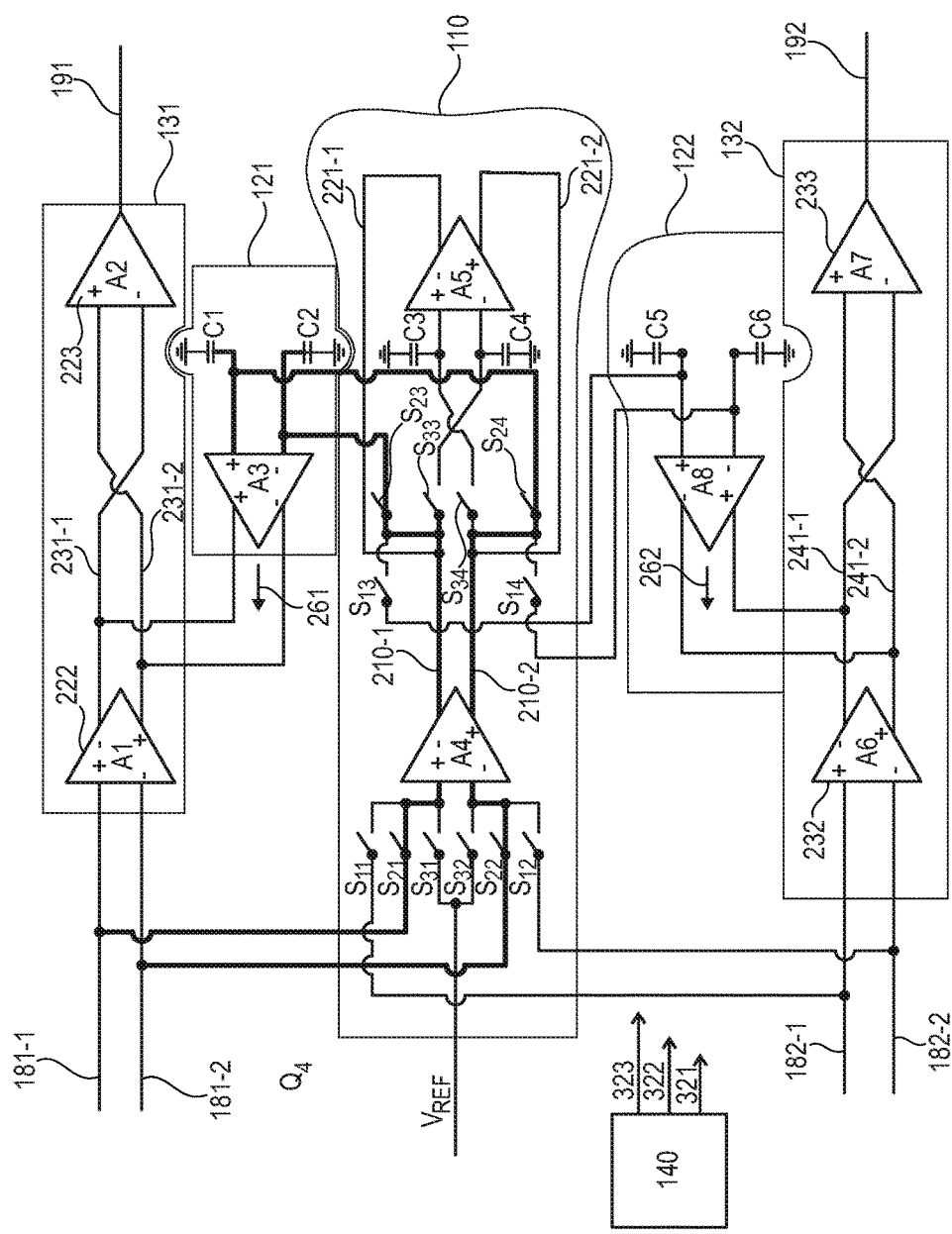
FIG. 7 is an example diagram illustrating generation of a second amplifier compensation setting according to embodiments herein.

Referring again to FIG. 3, in phase Q4, such as between time T4 and T5 for cycle #1, the controller 140 produces switch control output 323 to be a high state to activate the switches S21, S22, S23, and S24 to an ON state. During phase Q4, the controller 140 produces switch control output 322 to be a low state to deactivate the switches S21, S22, S23, and S24 to an OFF state. During phase Q4, the controller 140 produces switch control output 321 to be a low state to deactivate the switches S31, S32, S33, and S34 to an OFF state. FIG. 7 illustrates settings of switches and circuit connectivity for phase Q4.

Similar to cycle #1, the controller 140 repeats the control for each of multiple cycles (cycle #2, cycle #3, etc.) to continuously update both the amplifier compensation setting 111 (stored in capacitor C1 and C2) and amplifier compensation setting 112 (stored in capacitor C5 and C6) for each cycle. More specifically, the amplifier compensation setting 111 stored in respective storage circuit such as capacitors C1 and C2 is updated in phase Q4 of each cycle; the amplifier compensation setting 112 stored in storage circuit such as capacitors C5 and C6 is updated in phase Q2 of each cycle.

In one embodiment, the amplifier 131 and amplifier 132 provide non-stop amplification of the input signals 181 and 191 even though the amplifier compensation settings are updated during different portions of each cycle. Accordingly, in one embodiment, the correction output 261 applied to amplifier 131 and the correction output 262 applied to amplifier 132 are always updated to provide proper amplification of input signals 181 and 191 to produce respective output signals 182 and 192.

For 3 out of 4 phases of a respective cycle, a magnitude of a stored amplifier compensation setting is constant. During one phase, a respective amplifier compensation setting is potentially updated to a new value. For example, during phases Q1, Q2, and Q3, the current value of amplifier compensation setting 111 stored in the storage circuit (such as capacitors C1 and C2) is used as a basis to provide correction of corresponding input referred offset associated with the first amplifier 131. The magnitude of the amplifier compensation setting 111 is updated in phase Q4. The amplifier 131 provides continuous amplification of the input 181 into the output 191 throughout each of the multiple phases Q1, Q2, Q3, and Q4.

During phases Q1, Q3, and Q4, the value of amplifier compensation setting 112 stored in the storage circuit (such as capacitors C5 and C6) is used as a basis to provide correction of corresponding input referred offset associated with the second amplifier 132. The magnitude of the amplifier compensation setting 112 is updated in phase Q2. The amplifier 131 provides continuous amplification of the input 182 into the output 192 throughout each of the multiple phases Q1, Q2, Q3, and Q4.

Embodiments herein are useful over conventional techniques. For example, certain embodiments herein require only one offset correction circuit such as compensation setting generator 110 to compensate the input referred offset voltage associated with amplifiers 131 and 132. Thus, one embodiment herein includes sharing one offset compensator amongst multiple targeting amplifiers, which saves valuable circuit board area as well as cost of components otherwise needed to provide compensation. When implemented in power management POL circuit, direct use of PWM signal (such as an input form a power supply eliminates the need design an independent oscillator circuit, which further improves the simplicity of a respective amplifier circuit.

FIG. 4 is an example diagram illustrating automatic-zeroing (calibration) of a compensation-setting generator according to embodiments herein.

As previously discussed, in phase Q1, such as between time T1 and T2 for cycle #1, the controller 140 produces switch control output 321 to be a high state to activate the group of switches S31, S32, S33, and S34 to an ON state. During phase Q1, the controller 140 produces switch control output 322 as a low state to deactivate the group of switches S11, S12, S13, and S14 to an OFF state. During phase Q1, the controller 140 produces switch control output 323 to be in a low state to deactivate the group of switches S21, S22, S23, and S24 to an OFF state.

Activation of switches S31 and S32 to ON states causes the reference voltage Vref to be inputted to both the inverting out and non-inverting node of amplifier A4. The magnitude of Vref can be any suitable value. If amplifier A4 was an ideal operational amplifier, applying the same input voltage value to both the inverting and non-inverting would result in generation of the same output voltage for voltage 210-1 and voltage 210-2. However, due to the input referred offset voltage associated with amplifier A4, the magnitude of voltage 210-1 and voltage 210-2 are different.

In this example embodiment, during phase Q1, the amplifier A4 produces a respective output voltage 210-1 that is conveyed through switch S33 (activated to ON state as well) to the inverting input of transconductance amplifier A5 and storage circuit (capacitor C3). Capacitor C3 stores the generated voltage 210-1.

Amplifier A4 produces a respective output voltage 210-2 that is conveyed through switch S34 (activated to ON state) to the non-inverting input of transconductance amplifier A5 and storage circuit (capacitor C4). Capacitor C4 stores the voltage 210-2.

These operations in phase Q1 provide auto-zeroing of the amplifier A4 for subsequent use in phase Q2 used to update and generate the amplifier compensation setting 112 stored in capacitors C5 and C6. In other words, the storage circuit (such as capacitors C3 and C4) store a compensation value (such as one or more voltage values) that are used to correct input referred offset associated with the amplifier A4 when the amplifier A4 is subsequently used to generate the amplifier compensation setting 112 in following phase Q2.

FIG. 5 is an example diagram illustrating generation of a first amplifier compensation setting according to embodiments herein.

As previously discussed, in phase Q2, such as between time T2 and T3 for cycle #1, the controller 140 produces switch control output 322 to be a high state to activate the switches S11, S12, S13, and S14 to an ON state. During phase Q2, the controller 140 produces switch control output 323 to be a low state to deactivate the switches S21, S22, S23, and S24 to an OFF state. During phase Q2, the controller 140 produces switch control output 321 to be a low state to deactivate the switches S31, S32, S33, and S34 to an OFF state.

Activation of switch S11 to an ON state in phase Q2 causes the input signal 182-1 to be inputted to the non-inverting node of amplifier A4. Activation of switch S12 to an ON state in phase Q2 causes the input signal 182-2 to be inputted to the inverting node of amplifier A4. Thus, in phase Q2, via activation of the switches S11 and S12, the controller 140 is operable to: electrically couple the compensation-setting generator 110 to the input of the second amplifier 132, and electrically decouple (via deactivation of switches S21 and S22) the compensation-setting generator 110 from an input of the first amplifier 131.

In such an instance, during phase Q2, the amplifier A4 produces a respective output voltage 210-1 that is conveyed through switch S13 (activated to ON state) to the non-inverting input of transconductance amplifier A5 and storage circuit (capacitor C5). Capacitor C5 stores the voltage 210-1. The amplifier A4 also produces a respective output voltage 210-2 that is conveyed through switch S14 (activated to ON state) to the inverting input of transconductance amplifier A8 and storage circuit (capacitor C6). Capacitor C6 stores the voltage 210-2.

The prior stored voltage in capacitors C5 and C6 causes the transconductance amplifier A8 to provide correction to the voltage 210-1 and voltage 210-2 generated by the amplifier A4. Accordingly, the prior stored voltage in capacitors C3 and C4 provides correction to the amplifier A4 when generating the amplifier compensation setting 112 stored in capacitors C5 and C6 during phase Q2.

FIG. 6 is an example diagram illustrating an automatic-zeroing (calibration) of the compensation-setting generator according to embodiments herein.

As previously discussed, in phase Q3, such as between time T3 and T4 for cycle #1, the controller 140 produces switch control output 321 to be a high state to activate the switches S31, S32, S33, and S34 to an ON state. During phase Q3, the controller 140 produces switch control output 322 to be a low state to deactivate the switches S11, S12, S13, and S14 to an OFF state. During phase Q3, the controller 140 produces switch control output 322 to be a low state to deactivate the switches S21, S22, S23, and S24 to an OFF state.

Activation of switches S31 and S32 to ON states causes the reference voltage Vref to be inputted to both the inverting out and non-inverting node of amplifier A4. In such an instance, the amplifier A4 produces a respective output voltage 210-1 that is conveyed through switch S33 (activated to ON state as well) to the inverting input of transconductance amplifier A5 and storage circuit capacitor C3. Capacitor C3 stores the voltage 210-1.

Amplifier A4 produces a respective output voltage 210-2 that is conveyed through switch S34 (activated to ON state) to the non-inverting input of transconductance amplifier A5 and storage circuit capacitor C4. Capacitor C4 stores the voltage 210-2.

The operations in phase Q1 provide auto-zeroing of the amplifier A4 for subsequent use in phase Q4 used to update and generate the amplifier compensation setting 111 stored in capacitors C1 and C2. In other words, the storage circuit (such as capacitors C3 and C4) store a compensation value (such as voltage values) that are used to correct input referred offset associated with the amplifier A4 when the amplifier A4 is subsequently used to generate the amplifier compensation setting 111 in following phase Q4.

FIG. 7 is an example diagram illustrating generation of a second amplifier compensation setting according to embodiments herein.

In phase Q4, such as between time T4 and T5 for cycle #1, the controller 140 produces switch control output 323 to be a high state to activate the switches S21, S22, S23, and S24 to an ON state. During phase Q4, the controller 140 produces switch control output 322 to be a low state to deactivate the switches S21, S22, S23, and S24 to an OFF state. During phase Q4, the controller 140 produces switch control output 321 to be a low state to deactivate the switches S31, S32, S33, and S34 to an OFF state.

Activation of switch S21 to an ON state in phase Q4 causes the input signal 181-1 to be inputted to the non-inverting node of amplifier A4. Activation of switch S22 to an ON state in phase Q4 causes the input signal 181-2 to be inputted to the inverting node of amplifier A4. Thus, in phase Q4, via activation of the switches S21 and S22, the controller 140 is operable to: electrically couple the compensation-setting generator 110 to the input of the first amplifier 131, and electrically decouple (via deactivation of switches S11 and S12) the compensation-setting generator 110 from an input of the second amplifier 132.

In such an instance, during phase Q4, the amplifier A4 produces a respective output voltage 210-1 that is conveyed through switch S23 (activated to ON state) to the inverting input of transconductance amplifier A3 and storage circuit (capacitor C2). Capacitor C2 stores the voltage 210-1.

The amplifier A4 also produces a respective output voltage 210-2 that is conveyed through switch S24 (activated to ON state) to the non-inverting input of transconductance amplifier A3 and capacitor C1. Capacitor C1 stores the voltage 210-2.

The prior stored voltage in capacitors C3 and C4 causes the transconductance amplifier A5 to provide correction to the voltage 210-1 and voltage 210-2 generated by the amplifier A4. Accordingly, the prior stored voltage in capacitors C3 and C4 provides correction to the amplifier A4 when generating the amplifier compensation setting 111 stored in capacitors C1 and C2 during phase Q4.

Figure 8:
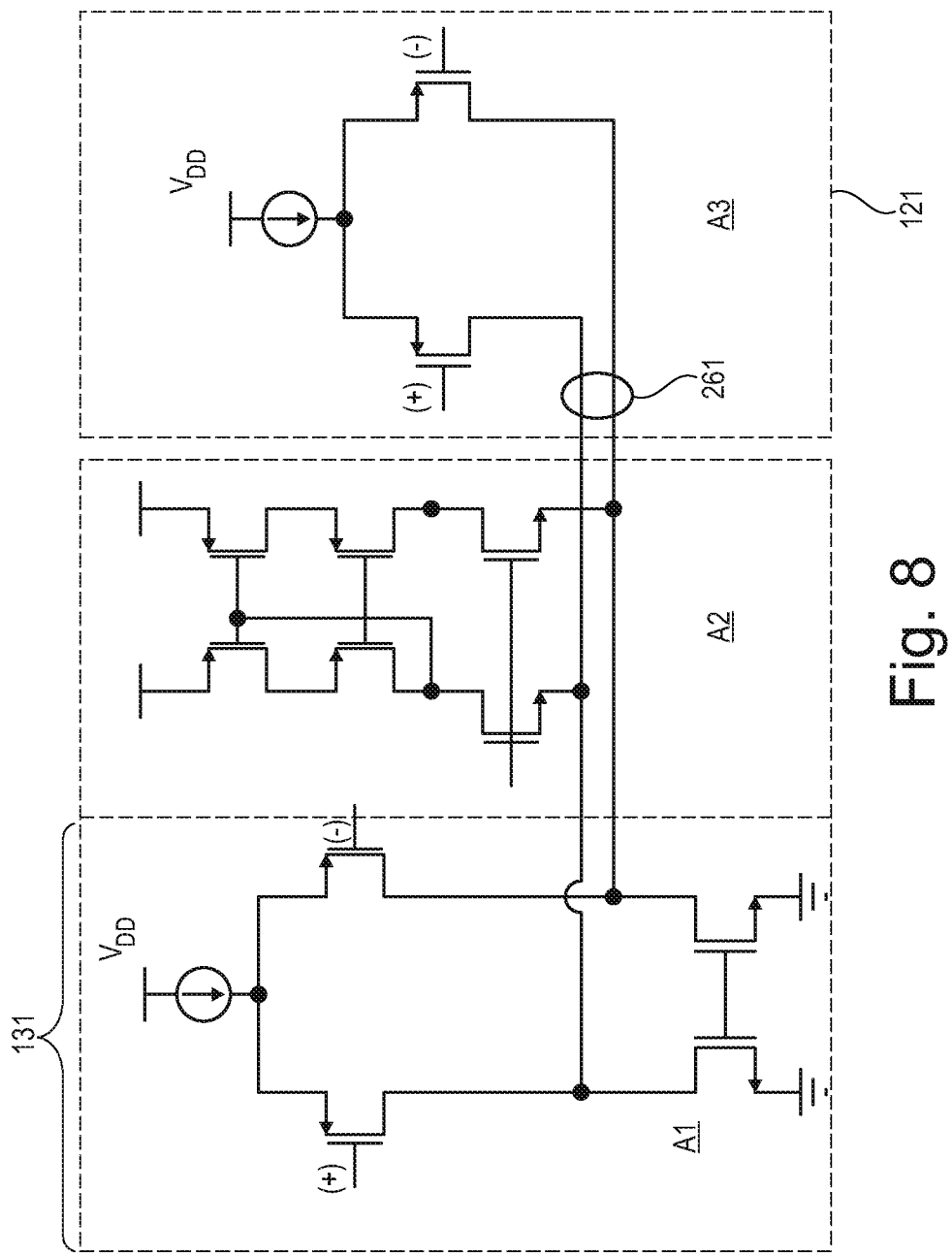
FIG. 8 is an example diagram illustrating an amplifier and compensator according to embodiments herein.

FIG. 8 is an example diagram illustrating a more specific implementation of an amplifier and compensator according to embodiments herein.

As shown in this example embodiment, and as previously discussed, transconductance amplifier A3 provides correction to amplifier 131 including amplifier A1 and A2. Amplifier 132 can be configured to include similar circuitry.

Figure 9:
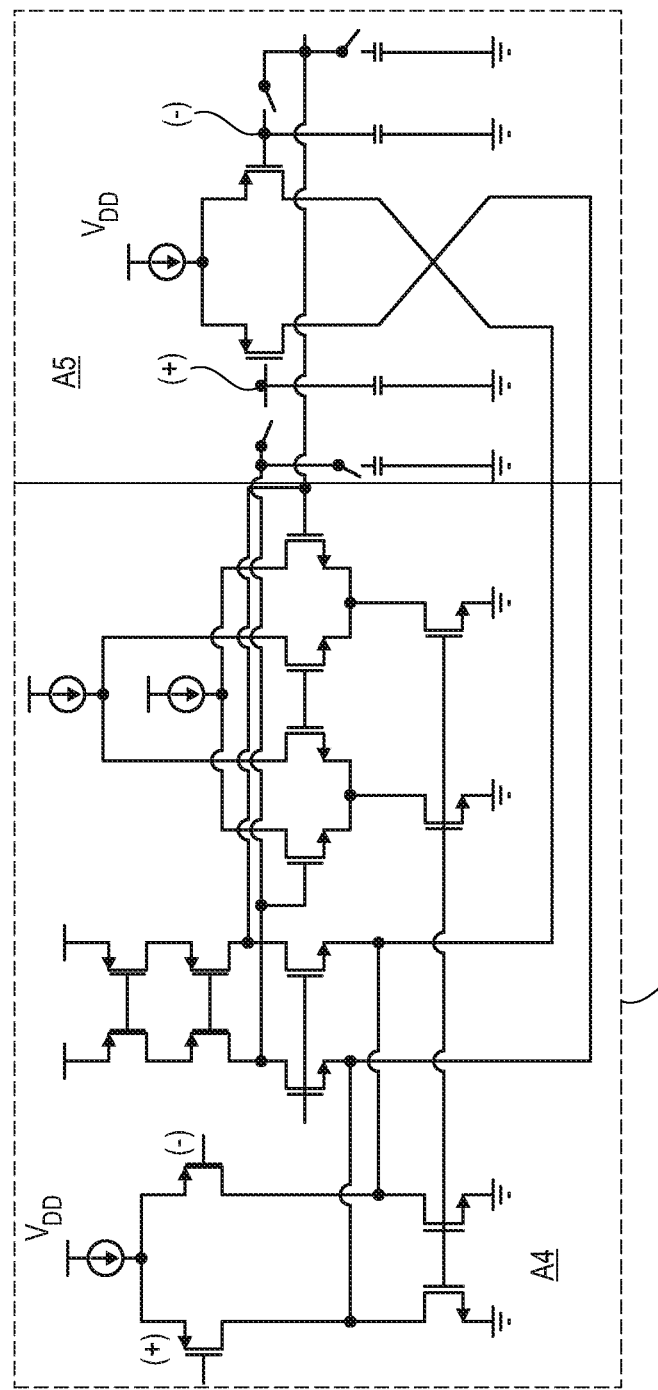
FIG. 9 is an example diagram illustrating a compensation-setting generator according to embodiments herein.

FIG. 9 is an example diagram illustrating a more specific implementation of a compensation-setting generator according to embodiments herein.

As shown in this example embodiment, and as previously discussed, transconductance amplifier A5 provides correction to amplifier A4 in the compensation setting generator 110.

Figure 10:
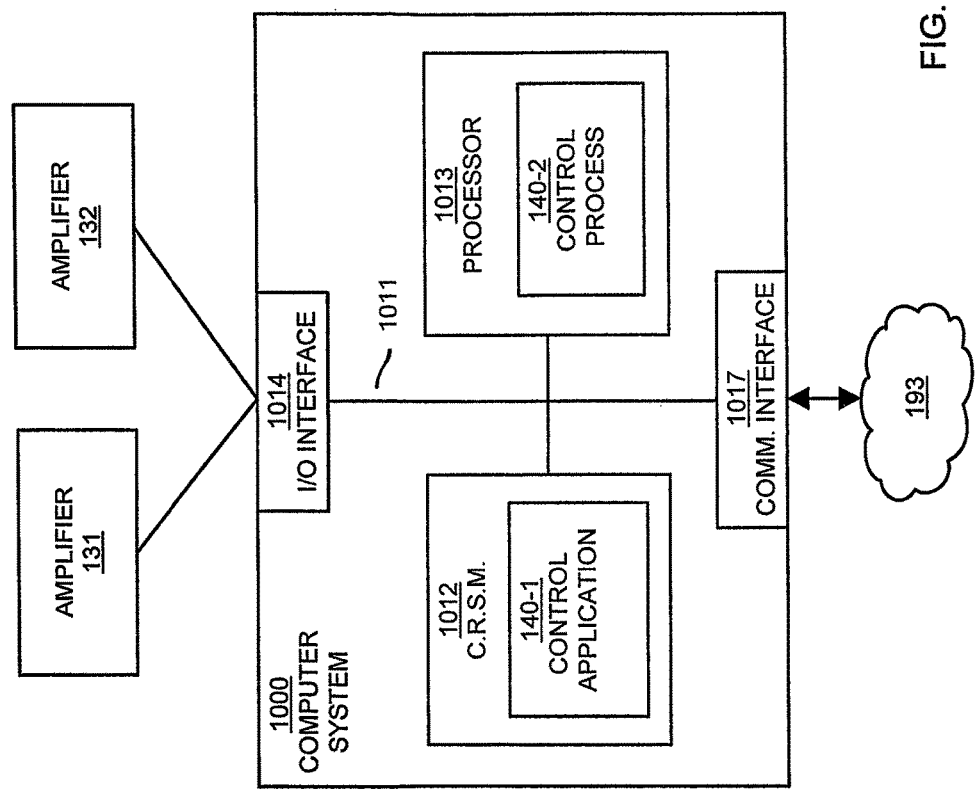
FIG. 10 is an example diagram illustrating computer processor hardware and related software instructions or logic circuit to execute methods according to embodiments herein.

FIG. 10 is an example block diagram of a computer device for implementing any of the operations as discussed herein according to embodiments herein.

As shown, computer system 1000 (such as implemented by any of one or more resources such as controller 140, compensation setting generator 110, compensator 121, etc.) of the present example includes an interconnect 1011 that couples computer readable storage media 1012 such as a non-transitory type of media (or hardware storage media) in which digital information can be stored and retrieved, a processor 1013 (e.g., computer processor hardware such as one or more processor devices), I/O interface 1014, and a communications interface 1017.

I/O interface 1014 provides connectivity to any suitable circuitry such as each of phases 110.

Computer readable storage medium 1012 can be any hardware storage resource or device such as memory, optical storage, hard drive, floppy disk, etc. In one embodiment, the computer readable storage medium 1012 stores instructions and/or data used by the control application 140-1 to perform any of the operations as described herein.

Further in this example embodiment, communications interface 1018 enables the computer system 1000 and processor 1013 to communicate over a resource such as network 193 to retrieve information from remote sources and communicate with other computers.

As shown, computer readable storage media 1012 is encoded with control application 140-1 (e.g., software, firmware, etc.) executed by processor 1013. Control application 140-1 can be configured to include instructions to implement any of the operations as discussed herein.

During operation of one embodiment, processor 1013 accesses computer readable storage media 1012 via the use of interconnect 1011 in order to launch, run, execute, interpret or otherwise perform the instructions in control application 140-1 stored on computer readable storage medium 1012.

Execution of the control application 140-1 produces processing functionality such as control process 140-2 in processor 1013. In other words, the control process 140-2 associated with processor 1013 represents one or more aspects of executing control application 140-1 within or upon the processor 1013 in the computer system 1000.

In accordance with different embodiments, note that computer system 1000 can be a micro-controller device, logic, hardware processor, hybrid analog/dif circuitry, etc., configured to control a power supply and perform any of the operations as described herein.

Functionality supported by the different resources will now be discussed via flowchart in FIG. 10. Note that the steps in the flowcharts below can be executed in any suitable order.

Figure 11:
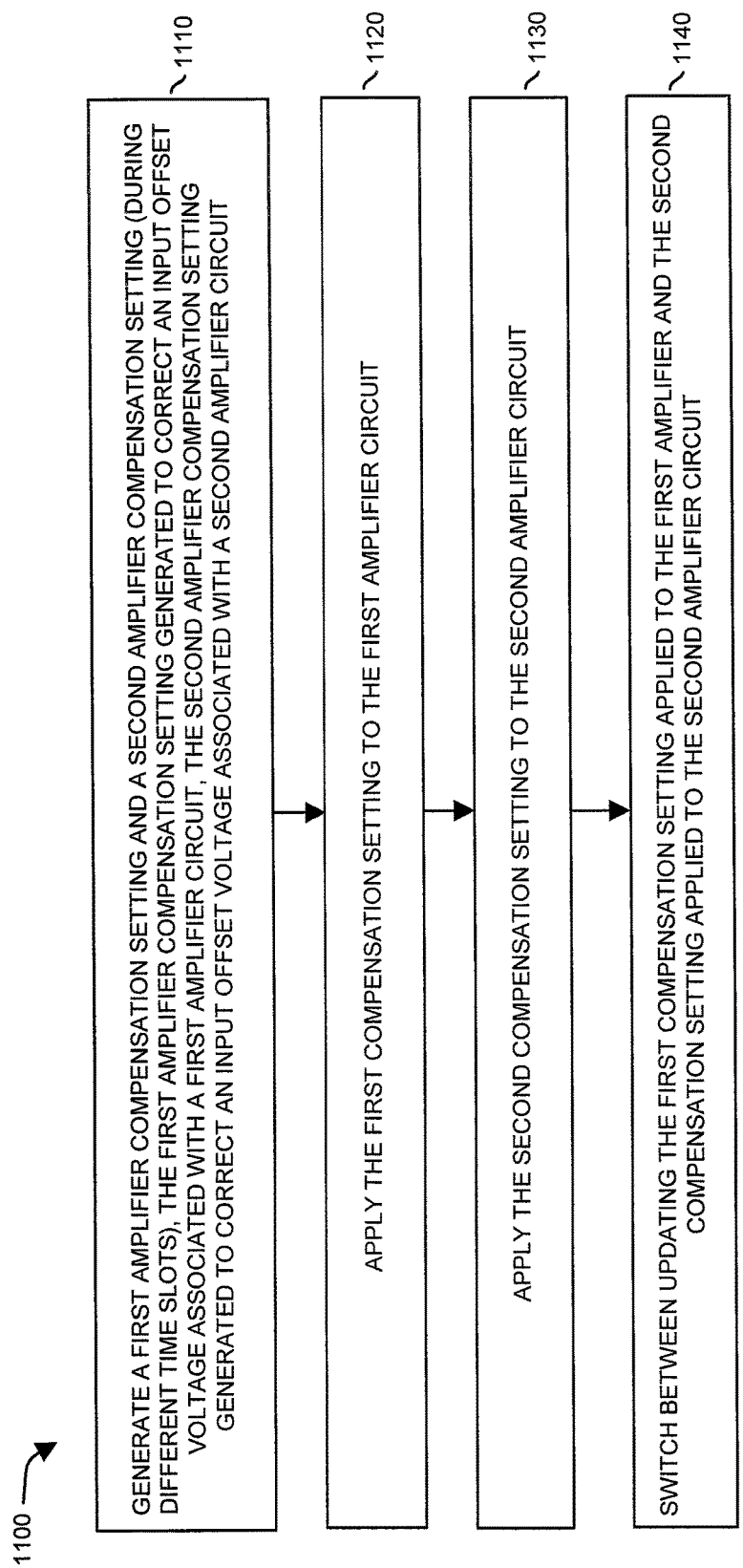
FIG. 11 is an example diagram illustrating a method according to embodiments herein.

FIG. 11 is an example diagram illustrating a method according to embodiments herein.

In processing operation 1110, the controller 140 controls compensation-setting generator 110 to generate a first amplifier compensation setting 111 and a second amplifier compensation setting 112 (during different time slots). In one embodiment, the first amplifier compensation setting 111 is generated to correct an input offset voltage associated with first amplifier 131; the second amplifier compensation setting 112 is generated to correct an input offset voltage associated with second amplifier 132.

In processing operation 1120, the controller 140 applies the first amplifier compensation setting 111 to the first amplifier 131.

In processing operation 1130, the controller 140 applies the second amplifier compensation setting 112 to the second amplifier 132.

In processing operation 1140, the controller 140 switches between updating the first compensation setting 111 applied to the first compensator 121 and the second compensation setting 112 applied to the second amplifier 132.

Note again that techniques herein are well suited for use in circuit applications such as those that include multiple amplifiers. However, it should be noted that embodiments herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

We claim:

1. An apparatus comprising:
   a first amplifier operable to receive a first signal;
   a second amplifier operable to receive a second signal;
   a compensation-setting generator operable to: i) receive the first signal inputted to the first amplifier, ii) derive a first differential compensation setting from the first signal, iii) receive the second signal inputted to the second amplifier, and iv) derive a second differential compensation setting from the second signal; and
   a controller operable to: i) apply the first differential compensation setting to the first amplifier and apply the second differential compensation setting to the second amplifier, and ii) switch between generating updates to the first differential compensation setting applied to the first amplifier and the second differential compensation setting applied to the second amplifier.

2. The apparatus as in claim 1,
   wherein the controller is further operable to, in different time slots, switch between controlling the compensation-setting generator to generate the updates to the first differential compensation setting and the second differential compensation setting.

3. The apparatus as in claim 1,
   wherein both the first amplifier and the second amplifier operate in a continuous amplification mode of amplifying a respective received signal while the compensation-setting generator generates the first differential compensation setting and the second differential compensation setting.

4. The apparatus as in claim 1, wherein the first differential compensation setting corrects an input offset voltage associated with the first amplifier; and
   wherein the second differential compensation setting corrects an input offset voltage associated with the second amplifier.

5. The apparatus as in claim 1 further comprising:
   a first compensator operable to provide first compensation to the first amplifier based on the first differential compensation setting;
   a second compensator operable to provide second compensation to the second amplifier based on the second differential compensation setting;
   wherein the first amplifier is a first multistage amplifier including a respective first amplifier stage coupled to drive a respective second amplifier stage, the first compensator operable to apply the first differential compensation setting to at least one node coupling the respective first amplifier stage to the respective second amplifier stage of the first amplifier; and
   wherein the second amplifier is a second multistage amplifier including a corresponding first amplifier stage coupled to drive a corresponding second amplifier stage of the second amplifier, the second compensator operable to apply the second differential compensation setting to at least one node coupling the corresponding first amplifier stage to the corresponding second amplifier stage of the second amplifier.

6. The apparatus as in claim 5, wherein the first compensator is a transconductance amplifier operable to produce a first differential correction signal applied to first differential nodes coupling the respective first stage of the first amplifier to the respective second stage of the first amplifier; and
   wherein the second compensator is a transconductance amplifier operable to produce a second differential correction signal applied to second differential nodes coupling the corresponding first stage of the second amplifier to the corresponding second stage of the second amplifier.

7. The apparatus as in claim 1, wherein
   the compensation-setting generator operable to repeatedly generate and update the first differential compensation setting and the second differential compensation setting in accordance with a cyclical time slot schedule.

8. The apparatus as in claim 7, wherein the cyclical time slot schedule is implemented based at least in part on a control signal operable to control generation of an output voltage from a power converter.

9. The apparatus as in claim 1, wherein
   the controller is further operable to: i) selectively couple the first signal to an input to the compensation-setting generator to produce the first differential compensation setting, and ii) selectively couple the second signal to the compensation-setting generator to produce the second differential compensation setting.

10. The apparatus as in claim 1,
wherein the controller, when generating the first differential compensation setting, is operable to: electrically decouple the compensation-setting generator from the second amplifier, and ii) electrically couple the compensation-setting generator to an input of the first amplifier receiving the first signal; and
wherein the controller, when generating the second differential compensation setting, is operable to: electrically decouple the compensation-setting generator from the first amplifier, and ii) electrically couple the compensation-setting generator to an input of the second amplifier receiving the second signal.

11. The apparatus as in claim 1 further comprising:
a first compensator operable to provide first compensation to the first amplifier based on the first differential compensation setting;
a second compensator operable to provide second compensation to the second amplifier based on the second differential compensation setting;
wherein the first compensator includes: i) a first storage circuit operable to store the first differential compensation setting, and ii) a first transconductance compensation amplifier operable to drive the first amplifier with a first differential correction signal whose magnitude depends on a magnitude of the first differential compensation setting stored in the first storage circuit; and
wherein the second compensator includes: i) a second storage circuit operable to store the second differential compensation setting, and ii) a second transconductance compensation amplifier operable to drive the second amplifier with a second differential correction signal whose magnitude depends on a magnitude of the second differential compensation setting stored in the second storage circuit.

12. The apparatus as in claim 11 further comprising:
wherein the compensation-setting generator includes an offset compensator, a transconductance amplifier stage, and a third storage circuit;
wherein the third storage circuit is operable to store a third differential compensation setting derived by the transconductance amplifier stage of the compensation-setting generator, the transconductance amplifier stage of the compensation-setting generator operable to output a correction signal whose magnitude depends on a magnitude of the third differential compensation setting stored in the third storage circuit.

13. The apparatus as in claim 1 further comprising:
a first compensator operable to generate a first correction signal based on the first differential compensation setting, the first compensator providing input offset voltage correction to the first amplifier via application of the first differential correction signal to a respective output node of the first amplifier; and
a second compensator operable to generate a second correction signal based on the second differential compensation setting, the second compensator providing input offset voltage correction to the second amplifier via application of the second correction signal to a corresponding output node of the second amplifier.

14. A method comprising:
deriving a first differential compensation setting from a first signal inputted to a first amplifier;
deriving a second differential compensation setting from a second signal inputted to a second amplifier;
applying the first differential compensation setting to the first amplifier;
applying the second differential compensation setting to the second amplifier; and
switching between updating the first differential compensation setting applied to the first compensator and the second differential compensation setting applied to the second amplifier.

15. The method as in claim 14 further comprising:
operating the first amplifier and the second amplifier in a continuous amplification mode of amplifying the first signal and the second signal while repeatedly switching between updating the first differential compensation setting and the second differential compensation setting.

16. The method as in claim 14 further comprising:
repeatedly generating and updating the first differential compensation setting applied to the first amplifier and the second differential compensation setting applied to the second amplifier in accordance with a cyclical schedule; and
implementing the cyclical schedule based at least in part on a control signal controlling generation of an output voltage from a power converter.

17. The method as in claim 14 further comprising:
storing the first differential compensation setting in a first storage circuit;
inputting the first differential compensation setting in the first storage circuit into a first compensator, the first compensator driving the first amplifier with a first correction signal whose magnitude depends on a magnitude of the first differential compensation setting stored in the first storage circuit;
storing the second differential compensation setting in a second storage circuit; and
inputting the second differential compensation setting in the second storage circuit into a second compensator, the second compensator driving the second amplifier with a second correction signal whose magnitude depends on a magnitude of the second amplifier compensation setting stored in the second storage circuit.

18. The method as in claim 14 further comprising:
generating a first correction signal based on the first differential compensation setting, the first correction signal providing input offset voltage correction to the first amplifier; and
generating a second correction signal based on the second differential compensation setting, the second correction signal providing input offset voltage correction to the second amplifier.

19. Computer-readable storage hardware having instructions stored thereon, the instructions, when carried out by computer processor hardware, cause the computer processor hardware to:
derive a first differential compensation setting from a first signal inputted to a first amplifier;
derive a secon differential compensation setting from a second signal inputted to a second amplifier;
apply the first differential compensation setting to the first amplifier;
apply the second differential compensation setting to the second amplifier; and switch between updating the first differential compensation setting applied to the first amplifier and updating the second differential compensation setting applied to the second amplifier.

20. The apparatus as in claim 1 further comprising:
a first compensator operable to generate a first differential correction signal from the first differential compensation setting, the first compensator operable to apply the first differential correction signal to a differential output nodes of the first amplifier; and
a second compensator operable to generate a second differential correction signal from the second differential compensation setting, the second compensator operable to apply the second differential correction signal to a differential output nodes of the second amplifier.

21. The apparatus as in claim 20, wherein the first differential correction signal is a first differential current signal, the first differential current signal including a respective inverting current output and a respective non-inverting current output applied to the differential output nodes of the first amplifier, the first differential correction signal operable to reduce effects of an input offset voltage associated with the first amplifier; and
wherein the second differential correction signal is a second differential current signal, the second different current signal including a corresponding inverting current output and a corresponding non-inverting current output applied to the differential output nodes of the second amplifier, the second differential correction signal operable to reduce effects of an input offset voltage associated with the second amplifier.

22. The apparatus as in claim 21, wherein the respective inverting current output of the first differential current signal flows in an opposite direction than the respective non-inverting current output of the first differential signal; and
wherein the corresponding inverting current output of the second differential current signal flows in an opposite direction than the corresponding non-inverting current output of the second differential signal.

23. The apparatus as in claim 1, wherein the first amplifier is a first transconductance amplifier;
wherein the second amplifier is a second transconductance amplifier;
wherein the first differential compensation setting controls a magnitude of a first differential current signal applied to an output of the first transconductance amplifier; and
wherein the second differential compensation setting controls a magnitude of a second differential current signal applied to an output of the second transconductance amplifier.

24. The apparatus as in claim 1 wherein
the compensation-setting generator includes an auxiliary transconductance amplifier operable to generate the first differential compensation setting and the second differential compensation setting, the compensation-setting generator including a storage circuit; and
wherein the compensation-setting generator stores a differential voltage in the storage circuit, the differential voltage in the storage circuit providing offset correction to the auxiliary transconductance amplifier in the compensation-setting generator when the compensation-setting generator produces the first differential compensation setting and the second differential compensation setting.

25. The apparatus as in claim 24, wherein the compensation-setting generator produces the differential voltage stored in the storage circuit in between operations of generating an update to the first differential compensation setting and generating an update to the second differential compensation setting.

26. The apparatus as in claim 1, wherein the controller is operable to update the first differential compensation setting based on an input to the first amplifier while the first amplifier produces a first output signal based on the input to the first amplifier; and
wherein the controller is operable to update the second differential compensation setting based on an input to the second amplifier while the second amplifier produces a second output signal based on the input to the second amplifier.

27. The apparatus as in claim 26, wherein the controller is operable to produce a third differential compensation setting in between operations of updating the first differential compensation setting and updating the second differential compensation setting, the third differential compensation setting correcting an offset of a transconductance amplifier in a compensation-setting generator producing the first differential compensation setting and the second differential compensation setting.

28. The method as in claim 14, wherein switching between updating the first differential compensation setting applied to the first amplifier and the second differential compensation setting applied to the second amplifier includes:
calibrating a compensation-setting generator that produces the first differential compensation setting and the second differential compensation setting via a reference voltage inputted to the compensation-setting generator in between phases of generating the first differential compensation setting and the second differential compensation setting.

29. The apparatus as in claim 1, wherein the controller is further operable to: calibrate the compensation-setting generator in between phases of updating the the first differential compensation setting and updating the second differential compensation setting.

30. The apparatus as in claim 1, wherein calibration of the compensation-setting generator in between phases of updating the first differential compensation setting and the second differential compensation setting includes: i) decoupling the first signal and the second signal from the compensation-setting generator; and ii) coupling a respective reference voltage to the compensation-setting generator.

31. The apparatus as in claim 1, wherein the compensation-setting generator is connected in parallel with the first amplifier and the second amplifier.

32. The apparatus as in claim 1, wherein the compensation-setting generator includes a switch interface operable to switch between selection of the first signal, the second signal, and a reference voltage; and
wherein selection of the first signal in a first phase updates the first compensation setting, selection of the second signal in a second phase updates the second compensation setting, and selection of the reference voltage in a third phase calibrates the compensation-setting generator for operation in the first phase and the second phase.

* * * * *

UNITED STATES PATENT AND TRADEMARK OFFICE
CERTIFICATE OF CORRECTION

PATENT NO. : 10,651,797 B2
APPLICATION NO. : 15/948398
DATED : May 12, 2020
INVENTOR(S) : Chen et al.

Page 1 of 1

It is certified that error appears in the above-identified patent and that said Letters Patent is hereby corrected as shown below:

In the Claims

Column 18, Claim 7, Line 57, after "the compensation-setting generator", insert --is--

Column 20, Claim 19, Line 62, delete "secon" and before "differential", insert --second--

Signed and Sealed this
Twenty-first Day of July, 2020

Andrei Iancu
*Director of the United States Patent and Trademark Office*